United States Patent [19]

Farina

[11] 4,283,791
[45] Aug. 11, 1981

[54] CIRCUIT ARRANGEMENT WITH FREQUENCY SYNTHESIS FOR THE TUNING OF RECEIVING SETS

[75] Inventor: Attilio Farina, Turin, Italy

[73] Assignee: Indesit Industria Elettrodomestici Italiana S.p.A., Turin, Italy

[21] Appl. No.: 735,564

[22] Filed: Oct. 26, 1976

[30] Foreign Application Priority Data

Nov. 11, 1975 [IT] Italy .................. 69771 A/75

[51] Int. Cl.³ .............................. H04B 1/32
[52] U.S. Cl. ...................... 455/183; 455/260
[58] Field of Search .............. 325/416, 418–421, 325/464, 452, 453, 464, 465; 334/11, 29; 455/173, 174, 177, 179, 182, 183, 186, 195, 196, 257, 258, 259, 260

[56] References Cited

U.S. PATENT DOCUMENTS

| | | | |
|---|---|---|---|
| 3,665,316 | 5/1972 | Jeffers | 325/308 |
| 3,883,807 | 5/1975 | Alberkrack | 455/183 |
| 3,898,566 | 8/1975 | Switzer et al. | 325/308 |
| 3,940,702 | 2/1976 | Yoshimura et al. | 325/464 |
| 3,961,261 | 6/1976 | Plfasterer | 325/335 |
| 4,088,959 | 5/1978 | Sumi | 455/183 |

OTHER PUBLICATIONS

CCTA Canadian Cable TV Association, Prize Papers 1974/75, Finlay et. al., pp. 18–26.
A Uniquely Simplified TV Tuning System, S. Hiliker, IEEE Transactions on Consumer Electronics, Feb. 1976, pp. 61–68.
A Modular Approach to Digital Tuning, G. Ledenbach, IEEE Transaction on Consumer Electronics, Aug. 1976, pp. 210–213.
Channels, Channels . . . and More Channels, No. 3/31/72–80, R. Powers, NCTA Convention, May 1972.

Primary Examiner—Robert L. Richardson
Assistant Examiner—Tommy P. Chin
Attorney, Agent, or Firm—Ladas & Parry

[57] ABSTRACT

A circuit arrangement for the selection and the tuning of a radio-electric signal in a signal receiving set is described.

The main feature of this set, which comprises a controllable local oscillator whose frequency is controlled by a control loop which maintains it in a fixed relationship with a number N, is the provision of means for calculating at least a substantial part of said number N, by starting from a plurality of signals representing a number K indicative of the signal to be tuned.

In particular the signal receiving set can be a television receiver, and said radio-electric signal to be tuned belongs to a television channel.

18 Claims, 1 Drawing Figure

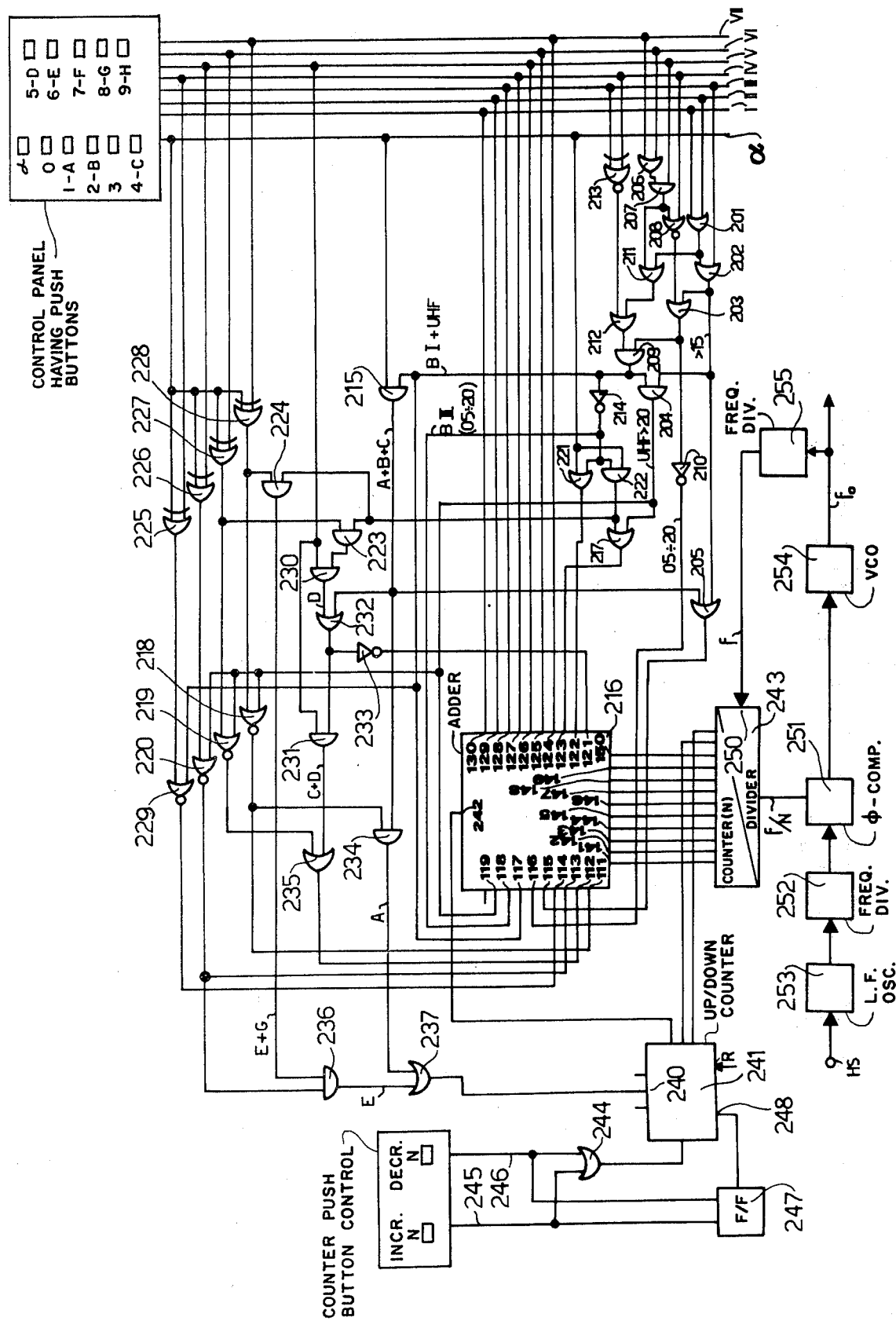

CIRCUIT ARRANGEMENT WITH FREQUENCY SYNTHESIS FOR THE TUNING OF RECEIVING SETS

BACKGROUND OF THE INVENTION

This invention relates to a circuit arrangement for the selection and the tuning of a radio-electric signal in a signal receiving set, comprising a controllable local oscillator whose frequency is controlled by a control loop which maintains it in a fixed relationship with a number N.

In a circuit arrangement of this type, suitable in particular for a television receiver, for selecting and tuning one of the various receivable television channels, the number N is obtained generally by the use of a memory of the read-only type (ROM) having a cell for each tunable television channel. In fact, the selection of each channel is carried out by means of one or more numbered push buttons on a control panel, whereby a particular number is caused to be sent to said read-only memory which, from the corresponding cell, generates another number which substantially determines said number N different for each channel. As can be seen from Table I at the end of this specification, in Europe there are today sixty selectable channels; to these channels have to be added five Italian channels. A further extension is foreseen for the future in view of the needs of cable television, and in fact additional channels, besides the sixty channels mentioned above, are already used in some countries (as for instance in Belgium). In the United States already today there are 82 channels. Therefore, it is necessary to provide memories with at least 80-90 cells of at least ten or even more bits each.

Such memories are necessarily very complex and expensive.

SUMMARY OF THE INVENTION

The object of the present invention is to provide a circuit arrangement which avoids the necessity of using such memories to obtain said number N. To this end, the present invention provides a circuit arrangement for tuning a signal among a plurality of radioelectric signals receivable in a signal receiving set, comprising a controllable local oscillator whose frequency is controlled by a control loop which maintains it in a fixed relationship with a number N;

and first means for calculating at least a substantial part of said number N by starting from a plurality of signals representing a number K indicative of the signal to be tuned.

BRIEF DESCRIPTION OF THE DRAWING

In order to be better understood the invention will now be described in detail with reference to the accompanying drawing given by way of illustrative and non limitative example.

DETAILED DESCRIPTION OF THE INVENTION

The drawing shows a circuit diagram of a part of a television tuner suitable for European and Italian channels, embodying the principles of the present invention.

The seven wires indicated by I, II, III, IV, V, VI and VII, which extend in a vertical parallel relationship on the righthand side of the diagram, are supposed to have applied thereon electric signals representing in binary code (0-1) the number of the television channel which is desired to be tuned. Such number is comprised between 1 and 99 (between 0000001 and 1100011 in binary code). On the wire VII there is present the signal of the least significant digit; on wire I there is present the signal of the most significant digit. A wire which extends in parallel of the left of the other seven wires and is marked by the greek letter $\alpha$ is supposed to have applied thereon a signal at logic level 1 for the Italian channels VHF (which are usually marked with a letter comprised between A and H) and a signal at logic level 0 for the European channels. These signals (relative to the number of the selected channel and to their being pertaining or not to the Italian channels VHF) can be obtained from the illustrated CONTROL PANEL HAVING PUSH BUTTONS connected to wires $\alpha$ and I-VII and having eleven push-buttons marked for example as follows:

1st push button = $\alpha$
2nd push button = 0
3rd push button = 1-A
4th push button = 2-B
5th push button = 3
6th push button = 4-C
7th push button = 5-D
8th push button = 6-E
9th push button = 7-F
10th push button = 8-G
11th push button = 9-H Push button $\alpha$, besides giving a signal at logic level 1 on the wire $\alpha$, serves also to inhibit the digital function of the push buttons which have a digital-literal significance.

Wires I and II are connected to the inputs of an OR gate 201 whose output, together with a connection from wire III, is connected to the inputs of an OR gate 202. The output of the OR gate 202 is connected to an input of an OR gate 203, to an input of an AND gate 204 and to an input of an OR gate 205. Wires VI and VII are connected to the two inputs of an OR gate 206 whose output, together with a connection from wire V, is connected to the two inputs of an AND gate 207. The output of this AND gate 207, together with a connection from wire IV, is connected to the two inputs of a NOR gate 208 whose output is connected to the other input of the OR gate 203. The output of said OR gate 203 is connected both to an input of an AND gate 209 and to an inverter 210. The output of the AND gate 207 is connected also to an input of an OR gate 211, the other input of which having connected thereto the output of the OR gate 201. The output of the OR gate 211 is connected to an input of an OR gate 212, the other input of which has connected thereto the output of an exclusive NOR gate 213 whose two inputs are connected to the wires III and IV. The output of the OR gate 212 is connected to the other input of the AND gate 209. The output of this AND gate 209 is connected to the other input of the AND gate 204, to the input of an inverter 214, to an input of an AND gate 215, to an input of a NOR gate 229 and to an input 117 of an adder 216 which effects the addition of a first addend of nine binary digits, which it receives at inputs numbered from 111 to 119, with a second addend of ten binary digits which it receives at inputs numbered from 121 to 130. The output of the AND gate 204 is connected to an input of an OR gate 217, to an input of NOR gates 218, 219 and 220 respectively, and to the input 119 of the adder 216. The output of the inverter 214 is connected to an input of an OR gate 221, to an input of an AND gate 222 and to the input 118 of the adder 216. The other input of the gates 221 and 222 is connected to the wire α. The output of the AND gate 222 is connected to the other input of the OR gate 217 and to an input of two AND gates 223 and 224 respectively.

The wire α is connected also to an input of exlusive OR gates 225, 226, 227 and 228 respectively. Gate 225, whose other input is connected to the wire IV, has its output connected to the other input of the NOR gate 229. Gate 226, whose other input is connected to the wire V, has its output connected to the other input of the gate 220. Gate 227, whose other input is connected to the wire VI, has its output connected to the other input of the gates 219 and 223. Gate 228, whose other input is connected to the wire VII, has its output connected to the other input of the gates 218 and 224. The wire V is connected to an input of two AND gates 230 and 231 respectively. Gate 230, whose other input is connected to the output of the gate 223, has its output connected to an input of an OR gate 232, whose output is connected to the other input of the gate 231 and to the input of an inverter 233. Connected to the other input of the gate 215 is the wire α, and the output of said gate 215 is connected to the other input of the OR gates 205 and 232 and to an input of an AND gate 234. The output of the gate 218 is connected to the other input of said gate 234 and to the input 111 of the adder 216. The outputs of the two gates 219 and 231 are connected to the two inputs of an OR gate 235, whose output is connected to the input 112 of the adder 216. The output of the gate 220 is connected to an input of an AND gate 236 and to the input 113 of the adder 216. To the inputs 114, 115 and 116 of the adder 216 are connected, respectively, the outputs of the NOR gate 229, of the OR gate 205 and of the inverter 210. To the inputs 121, 122 and 123 of the adder 216 there are connected the outputs of the inverter 233, of the OR gate 221 and of OR gate 217, respectively. The inputs from 124 to 130 of said adder 216 are, instead, connected, sequentially, to the wires VII, VI, V, IV, III, II and I.

The output of the AND gate 224 is connected to the other input of the AND gate 236, whose output, together with the output of the gate 234, is connected to the inputs of an OR gate 237. The output of the gate 237 is connected to an input 240 of a three bit counter 241, able to count both up and down from 0 to +7, provided with a reset input R which brings it not to zero but to +4. The counter 241 has three output wires, of which the one which corresponds to the most significant digit is connected to an additional input 242 of the adder 216, while the other two wires are connected to the two most rightward inputs, corresponding to the less significant digits, of a programmable counter-divider 243. The input of the counter 241 is connected to the output of an OR gate 244, at the two inputs of which there arrive two wires 245 and 246 connected to two control push buttons INCR.N and DECR.N of a COUNTER PUSH BUTTON CONTROL which change the logic level of said wires. Said two wires 245 and 246 are connected also to the two inputs of a bistable multivibrator 247, whose output arrives at a count direction control input 248 of the counter 241.

The adder 216 has ten outputs, indicated progressively by reference numerals 141 to 150, which are connected to the ten inputs, corresponding to the most significant bits, of the counter-divider 243. Said counter-divider 243 comprises the COUNTER (N) which is a twelve bit counter which forms a number N, and the DIVIDER which is a divider which receives at an input 250 a signal at frequency f and supplies in output a signal at frequency f/N. The output of the counter-divider 243 is connected to an input of a phase comparator 251, to the other input of which is connected the output of a frequency divider 252 which divides in the ratio 1:16. The input of the divider 252 is connected to the output of a line frequency oscillator 253 which receives, through a terminal HS, from the corresponding known section of the receiver (not shown), the line synchronism pulses. The output of the comparator 251 is connected to the control input of a VCO oscillator (Voltage-Controlled-Oscillator) 254, whose output at frequency $f_o$, besides being sent to a tuner (known and not shown), arrives at a frequency divider 255 which divides in the ratio 1:256. The output of the divider 255 arrives at the input 250 of the counter-divider 243.

The operation of the circuit arrangement described hereinabove will now be explained.

Through the push button panel connected to the wires α, I, II, III, IV, V, VI and VII, by pressing a couple of push buttons a combination of signals is obtained in binary code, on said seven wires and on wire α, in conformity to the various channels, as it results from the following scheme.

| Push buttons | Signals on the wires | Channels |
|---|---|---|
| 00 = | 0 0000000 | zero |
| 01 = | 0 0000001 | 1 |
| 02 = | 0 0000010 | 2 |
| 10 = | 0 0001010 | 10 |
| 99 = | 0 1100011 | 99 |
| α1 = | 1 0000001 | A |
| α2 = | 1 0000010 | B |
| α9 = | 1 0001001 | H |

I,e., it is possible to form 110 combinations of said signals, by means of said push button panel, equal to 110 selectable channels.

However, in practice, as can be seen from Table I, since channels B, D and H are equal to channels 4, 5 and 10 respectively, the different channels selectable are reduced to 107. Moreover, of these channels, channels 0 and 1, as well as channels α0 and α3, do not exist. Therefore, the really selectable channels are 103, of which 65 are presently in use (16 in the range VHF+49 in the range UHF). The remaining 38 channels [8 in the range VHF (from channel 13 to channel 20)+30 in range UHF (from channel 70 to channel 99)] are available for future use. Some of the channels from 13 to 20 have already been used for transmissions by cable (CATV), for instance in Belgium. Referring again to the wiring diagram shown in the drawing, it can be seen that the circuit formed by the logic OR gates 201 and 202 supplies a signal at level 1 for all those circuits whose number is greater than 15; the further circuit formed by the gates OR 206, AND 207, NOR 208, OR 203 and by the inverter 210 supplies, in combination with the preceding circuit, a signal at level 1 for the channels whose number is comprised between 5 and 15; the circuit formed by the gates NOR exclusive 213, OR 211, OR 212, AND 209 and by the inverter 214 supplies, in combination with the preceding circuits, a signal at level 1 for the channels having a number between 5 and 20; finally, gate AND 204 supplies, in combination with the preceding circuits, a signal at level 1 for all those channels whose number is greater than 20. All this will be clearly apparent from annexed Table II.

The counter-divider 243 receives thus the instruction to divide the signal at frequency f which it receives at the input 250, by the number N (of twelve bits) whose ten more significant bits come from the outputs of the adder 216, and the last two bits come from the two less significant outputs of the counter 241. Since the comparator 251 receives from the divider 252 a reference signal at a frequency of 976.5625 Hz obtained through frequency division of the 15625 Hz line frequency output of oscillator 253 by the factor 16 in divider 252, comparator 251 supplies an output error signal to the voltage-controlled local oscillator 254 and changes the frequency $f_o$ when the signal f/N received from counter-divider 243 has a different frequency from that of the signal received from divider 252. Therefore, local oscillator 254 generates a signal modified so that signal f/N becomes of the same frequency as that of the signal from divider 252, i.e. f/N=976.5625 Hz. But, $f/N=f_o/256\times 1/N$ and, therefore, local oscillator 254 is controlled by its input error signal to generate the frequency:

$f_o=(256\times 976.5625\times N)$ Hz whence, $$N = \frac{f_o}{256 \times 976.5625}.$$

It follows that if the intermediate frequency of the receiving set is 38.75 MHz and $F_{pv}$ is the frequency of the video carrier of the channel to be received, the frequency $f_o$ sent to the tuner must be:

$f_o=(F_{pv}+38.75)$ MHz.

Therefore, the number N is given by the relation:

$$N = \frac{F_{pv} + 38.75}{256 \times 976.5625 \times 10^{-6}} = 4\,(F_{pv} + 38.75) = 4f_o.$$

In binary notation, for multiplying a number by four, it is sufficient to place two zeroes to the right of the number whereby the zeros become the two least significant digits of the modified number (binary product). Accordingly, this is carried out at the two rightmost inputs of counter 243, the first ten bits of the number N being supplied to the remaining ten inputs of counter 243 from adder 216 to represent in MHz the value of the frequency $f_o$, which the local oscillator 254 has to assume. Let us see now how these inputs from adder 216 represent said frequency $f_o$.

It has to be noted that, with the hypotheses which have been made, and with reference to Table I (which is an internationally established table setting forth, for each channel number or letter, a predetermined value of frequency assigned for the vidio carrier), the frequency $f_o$ is bound to the number K of the television channel by the following relations, for the various ranges (it has to be noted that for the Italian channels the number K is given by the number associated with the respective letter on the push button panel):

BI (channel 2-4):
$f_o=73+7K=[64+(7-K)]+[8K+1]+1$

BIII (channel 5-15):
$f_o=179+7K=[160+(15-K)]+[8K+3]+1$

BIII (channel 16-20):
$f_o=179+7K=[144+(31-K)]+[8K+3]+1$

UHF (channel 21-99):
$f_o=342+8K=[336]+[8K+5]+1$

Channel A:
$f_o=83.5+9K=[80+K]+[8K+2]+1+0.5$

Channel B: $f_o=83+9K=[80+K]+[8K+2]+1$

Channel C: $f_o=85+9K=[80+K]+[8K+2]+1+2$

Channel D:
$f_o=169+9K=[160+K]+[8K+7]+1+1$

Channel E:
$f_o=168.5+9K=[160+K]+[8K+7]+1+0.5$

Channels F,G,H:
$f_o=168+9K=[160+K]+[8K+7]+1$ said relations, for the various tunable channels, are seen to be the sum of a first constant number with the product of the number K and a second constant number. These relations, which give the value of $f_o$, are not calculated directly in the circuit, but are obtained by calculating the second expressions comprising the terms shown above in brackets. The calculating, as will be more fully explained hereinafter, is automatically effected and the results are obtained at the outputs 141-150 of the adder 216 from the signals on wires I-VII representing the number K and the signals on wire a by way of the various logic gates 201-237 which are interconnected in the specific configuration described and to the inputs 111-119, 121-130 and 242 of adder 216.

It should be noted also that for multiplying by eight a binary number it is sufficient to add three zeroes to it, and that the expressions $(7-K)$; $(15-K)$; $(31-K)$ are obtained from the last three or four inverted digits of the number K expressed in binary code, as shown by the following examples (the last three digits in band I, the last four digits in band III)

| | |
|---|---|
| K = 3 = 011 | 7-K = 4 = 100 |
| K = 10 = 1010 | 15-K = 5 = 0101 |
| K = 18 = 10010 | 31-K = 13 = 1101 |

If the first expression between square brackets of the relations written hereinabove is sent to the inputs 111 to 119 of the adder 216 and the second expression between square brackets is sent to the inputs 121 to 130, there remain to be added only the digits outside the square brackets. The first of them, which is always 1, is added on the additional input 242. The remaining corrections are carried out on the channels A, C, D, E in a way which will be explained later. The first expression between square brackets, which is of the type P−K for the European VHF channels, P+K for the Italian channels, P for the channels in UHF, is formed and sent to the inputs 111 to 120 in the following manner.

The number P is obtained from a series of logic gates, as will be explained hereinafter; the term ± K or zero is obtained by connecting the wires IV, V, VI and VII, which correspond to the four less significant digits of the number K, to the four less significant inputs of the lefthand side of the adder, i.e. 111, 112, 113 and 114 through the four OR exclusive gates 225, 226, 227 and 228 and through the four NOR gates 229, 220, 219 and 218. Said NOR gates act as inverters (to obtain the minus sign for the European channels in the range VHF); as can be seen from the diagram, the gate OR 229 is blocked in the range UHF and in Band I (in which three digits only have to be inverted); the other three gates 218, 219 and 220 are blocked in UHF, so that in UHF at the inputs 111, 112, 113 and 114 of the adder 216 there arrive four zeroes. The OR exclusive gates 225, 226, 227 and 228 controlled by the signal on wire α carry out a second inversion on the Italian channels which cancels the inversion effected by the gates 218, 219, 220 and 229, so as to obtain the plus sign for the expression P+K.

The second expression between square brackets, which is of the type [8K+S], is obtained in a simple way by connecting the seven most significant inputs of the right hand side of the adder 216, i.e. from 124 to 130, to the seven wires I, . . . VII, corresponding to the seven digits of the number K of the channel, and by connecting the remaining three inputs 121,122 and 123 to logic gates for obtaining the number S (which is always less than 8).

On channels C and D there is also introduced a 1 on the second less significant input of the left hand side of the adder 216, i.e. on the input 112, by means of the OR gate 235. Thus, a digit 2 is added to the number P. In this way, also the channel C is corrected, while it sill remains to take away 1 on the channel D and to add 0.5 on channels A and E.

The annexed Table III summarizes the functions of the adder 216 on the various Italian channels and on five European channels taken as example.

Observing the Table III it can be seen that the first digit (starting from the right) of the second addend is always 1, except channels A,B,C,D (for channel D the term 8K+7 has become 8K+6, since a digit 1 has been taken away, to compensate for the addition of the digit 2 by means of the gate 235); said first digit is obtained by means of the AND gates 230, 223 and 215, the OR gate 232 and the inverter 233. The second digit of the second addend is 1 in Band III and also in all the Italian channels; this is obtained by means of the OR gate 221. The third digit is 1 in UHF and in the Italian channels in Band III; this is obtained by means of the AND gate 222 and the OR gate 217. In the first addend, the fifth digit is 1 in the channels A,B,C and in the channels over 15, which is obtained by means of the OR gate 205; the sixth digit is 1 in the channels between 5 and 15, which information is already available from the aforementioned inverter 210; the seventh digit is always 1, except for the Band III, while the eighth digit, instead, is 1 in Band III (such informations are available upstream and downstream of the inverter 214); the ninth digit is 1 in UHF, and namely it is obtained by means of the AND gate 204.

As can be seen by comparing the Table I with the Table III, the frequency $f_o$ obtained is thus corrected for all channels, except channels A and E for which it is by 0.5 MHz less than it should be. To understand how also this correction is carried out it is first of all necessary to explain the function of the counter 241, the bistable multivibrator 247 and the OR gate 244. The counter 241 is normally reset to its original value, which is 4, on switching on the set and whenever the number of a channel is formed, owing to a pulse which it receives at the terminal marked R. The counter 241 supplies the number 4 which is sent under the form of a 1 to the additional input 242 of the adder 216 (as already considered in Table III) and under the form of two zeroes to the two right hand inputs of the counter 243, to form the number $N=4$ $f_o$. On the channels A and E, however, the number 4 (100 in binary code) is changed into 6 (110) by means of the AND gates 234 and 236 and the OR gate 237, which send a signal 1 to the input 240 of the counter 241. In this way, a signal 1 arrives as second digit to the counter 243 which thus divides, for instance on channel A, by 00101110010, i.e. by $N=370$, hence $f_o=(N/4)=92.5$.

However, the main function of the counter 241 is another one, namely that of allowing to correct at will the frequency $f_o$ by altering the number N. The wires 245 and 246, whenever the respective push buttons are pressed, by means of the gate 244 and multivibrator 247 control the counter 241, and consequently the counter 243, to make them increase or respectively reduce by 1 unit the count, i.e. the number N.

The maximum possible correction in more is normally of 3 units (i.e. 0.75 MHz) (of one unit only on channels A and E); the maximum possible correction in less is normally of four units (i.e. 1 MHz) (of 6 units on channels A and E).

From the foregoing description there appear clearly the advantages of the circuit arrangement for a tuner according to the present invention: high number of channels selectable without needing large memories to store all the respective numbers; possibility of correcting the tuning; possibility of tuning both European and Italian channels; easy integration of the whole circuit.

It is obvious that the arrangement described hereinabove is susceptible of many variations.

By way of example only we mention:

the exclusion of the selection of the VHF channels above the 16th and/or of the Italian channels B, D, H which can be received also by forming the numbers 04, 05, 10, with the resulting simplification of the circuit through omission of some logic gates;

the renouncement to correct the ½ MHz on the obtained frequency $f_o$ for the channels A and E so that AND gates 234 and 236 and OR gate 237 can be omitted, resulting in no arrival of an input signal at terminal 240 of counter 241;

the modification for arranging the tuner to be apt to receive the signals of the American television channels instead of the European ones; for the American channels, since they are disposed with a 6 MHz step both in VHF and in UHF, the expressions of $f_o$ are all of the type $f_o=T+6K$, where T is a fixed number, which expressions are easily obtainable by breaking out the factor 6 into (4+2), i.e. $f_o=T+4K+2K$, where it is clear that to multiply by two in binary code it is sufficient to add a zero and to multiply by 4 it is sufficient to add two zeroes; or, it is possible to obtain the factor 6 as (8-2); and so on. Therefore, it is sufficient to send the signals representing said number K to a first counter whose least significant input receives a zero, and to a second counter having two least significant inputs each of which receives a zero, and then add to the binary signals representing said number T the binary outputs of the first and second counters.

It is obvious that such variations, as well as other variations within the capacity of those skilled in the art, may be effected without departing from the scope of the principles of novelty inherent in the present inventive idea.

TABLE I

| BAND | EUROPEAN CHANNELS IN USE AT PRESENT TIME | ITALIAN CHANNELS | $f_o$(MHz) |
|---|---|---|---|
| I | 02 | | 87 |
| | | A | 92.5 |
| | 03 | | 94 |
| | 04 | | 101 |
| | | B | 101 |
| | | C | 121 |
| III | 05 | D | 214 |
| | 06 | | 221 |
| | | E | 222.5 |
| | 07 | | 228 |
| | | F | 231 |
| | 08 | | 235 |
| | | G | 240 |
| | 09 | | 242 |
| | 10 | H | 249 |
| | 11 | | 256 |
| | 12 | | 263 |
| UHF | 21 | | 510 |
| | 22 | | 518 |
| | 23 | | 526 |
| | 24 | | 534 |
| | — | | — |
| | — | | — |
| | 67 | | 878 |
| | 68 | | 886 |
| | 69 | | 894 |

Total European channels 3 + 8 + 49 = 60
Total Italian channnesl 3 + 5 + 49 = 57
Total European + Italian channels: 5 + 11 + 49 = 65

TABLE II

| gates | Signal at high level (1) produced by signals on wire α and I-VII determined by the selection of channels: | Input of adder 216 |
|---|---|---|
| 201 | 32-99 | |
| 202 | 16-99 | |
| 203 | 0-14; 16-99 | |
| 204 | 21-99 | 119 |
| 205 | A,B,C; 16-99 | 115 |
| 206 | 1-3; 5-7; 9-11; 13-15; 17-19; 21-23, and so on | |
| 207 | 5-7; 13-15; 21-23; 29-31; 37-39; and so on | |
| 208 | 0-4; 16-20; 32-36; 48-52, and so on. | |
| 209 | 0-4; 21-99 | 117 |
| 210 | 5-15 | 116 |
| 211 | 5-7; 13-15; 21-23; 29-99 | |
| 212 | 0-7; 13-15; 21-99 | |
| 213 | 0-7; 24-31; 48-55; 72-79; 96-99 | |
| 214 | 5-20 | 118 |
| 215 | A,B,C | |
| 217 | D,E,F,G,H; 21-99 | 123 |
| 218 | A,D,F,H; even channels from 0 to 20 | 111 |
| 219 | B,E,F; 0,1,4,5,8,9,12,13, 16,17,20 | |
| 220 | C,D,E,F; 0-3; 8-11; 16-19 | 113 |
| 221 | A,B,C,D,E,F,G,H; 5-20 | 122 |
| 222 | D,E,F,G,H | |
| 223 | D,G,H | |
| 224 | E,G | |
| 225 | A,B,C,D,E,F; 8-15; 24-31; 40-47; and so on | |
| 226 | A,B,G,H; 4-7; 12-15; 20-23; 28-31; 36-39 and so on | |
| 227 | A,C,D,G,H; 2,3,6,7,10,11, 14,15,18,19,22,23, and so on | |
| 228 | B,C,E,G; odd channels | |
| 229 | G,H; 5-7; 16-20 | 114 |
| 230 | D | |
| 231 | C,D | |
| 232 | A,B,C,D | |
| 233 | E,F,G,H; 0-99 | 121 |
| 234 | A | |
| 235 | B,C,D,E,F; 0,1,4,5,8,9,12, 13,16,17,20 | 112 |
| 236 | E | |

TABLE II-continued

| gates | Signal at high level (1) produced by signals on wire α and I-VII determined by the selection of channels: | Input of adder 216 |
|---|---|---|
| 237 | A,E | |

TABLE III

| Channel | Code | 1st Addend inputs 111 | 2nd Addend inputs 121 | input 242 | Outputs 141 ($f_o$) |
|---|---|---|---|---|---|
| A | α1 | 0001010001 | 0000001010 | 1 | 92 |
| B | α2 | 0001010010 | 0000010010 | 1 | 101 |
| C | α4 | 0001010110 | 0000100010 | 1 | 121 |
| D | α5 | 0010100111 | 0000101110 | 1 | 214 |
| E | α6 | 0010100110 | 0000110111 | 1 | 222 |
| F | α7 | 0010100111 | 0000111111 | 1 | 231 |
| G | α8 | 0010101000 | 0001000111 | 1 | 240 |
| H | α9 | 0010101001 | 0001001111 | 1 | 249 |
| 3 | 03 | 0001000100 | 0000011001 | 1 | 94 |
| 10 | 10 | 0010100101 | 0001010011 | 1 | 249 |
| 18 | 18 | 0010011101 | 0010010011 | 1 | 305 |
| 21 | 21 | 0101010000 | 0010101101 | 1 | 510 |
| 69 | 69 | 0101010000 | 1000101101 | 1 | 894 |

What I claim is:

1. In an electronic circuit arrangement having a programmable frequency divider arranged to obtain from a voltage controlled tuning oscillator, as a function of a respective dividing number "N" in binary form for the tuning of each of a plurality of tunable channels in a receiver, a respective frequency signal, and means for comparing said respective frequency signal with a frequency reference oscillation and producing a resultant signal supplied to said voltage controlled tuning oscillator for the desired tuning, the improvement comprising:

(a) a control panel having push buttons;

(b) first means actuable by at least one of said push buttons to produce signals representing at least one binary coded number K indicative of the number of a channel to which said receiver is to be tuned according to a predetermined assigned channel frequency;

(c) second means for producing output signals representing in binary coded form the value of the respective frequency of said voltage controlled oscillator, said value corresponding, for the various tunable channels, to the sum of a first constant binary coded number with the product of said binary coded number K and a second constant binary coded number and being obtained indirectly from said first and second constant binary coded numbers through intermediate expressions for each channel in response to the signals produced by said first means; and (d) third means for obtaining said number N by multiplying said value of the respective frequency of said voltage controlled tuning oscillator obtained from said second means by a coefficient depending on the value of said reference oscillation frequency.

2. The circuit arrangement of claim 1, wherein said second means comprise a plurality of logic gates.

3. The circuit arrangement of claim 2, wherein said second means comprise an arithmetic adder circuit.

4. The circuit arrangement of claim 3, wherein said adder circuit is an adder which operates in binary code.

5. The circuit arrangement of claim 4, wherein said adder effects the addition of at least a first addend and a second addend, and produces said output signals of said second means.

6. The circuit arrangement of claim 5, in which said receiver is a television receiver, wherein said first addend is represented for the various tunable channel by a number P or by an expression (P+K) or (P−K), P being a first number which remains fixed for a certain number of tunable television channels in various frequency ranges.

7. The circuit arrangement of claim 5, in which said receiver is a television receiver and in which said plurality of tunable channels are grouped according to various frequency ranges, wherein said first addend is represented by a fixed number P for signals receivable in the UHF range and by an expression (P+K) for signals receivable in the VHF range.

8. The circuit arrangement of claim 5, in which said receiver is a television receiver and in which said plurality of tunable channels are grouped according to various frequency ranges, wherein said first addend is represented by a fixed number P for signals receivable in the UHF range and by an expression (P−K) for signals receivable in the VHF range.

9. The circuit arrangement of claim 6, wherein said number P is a multiple of 16.

10. The circuit arrangement of claim 5, in which said receiver is a television set, wherein said second addend is represented, for the various tunable channels, by an expression (S+8K), where S is a second number which remains fixed for a certain number of tunable channels in various frequency ranges.

11. The circuit arrangement of claim 10, wherein said number S is less than 8.

12. The circuit arrangement of claim 4, in which said receiver is a television set, wherein said adder effects an addition of a first term T, a second term 4K and a third term 2K, where T is a number which remains fixed for a certain number of channels to be tuned.

13. The circuit arrangement of claim 5, wherein said first addend is represented by a number in binary form and is obtained from said signals representing said number K, through a plurality of logic gates, and wherein in particular the part of said first addend which is proportional to K is obtained by means of an exclusive OR gate connected in series to a NOR gate on each one of the four inputs of said adder which correspond to four least significant digits of said binary number representing said first addend.

14. The circuit arrangement of claim 10, wherein said second addend is represented by a number in binary form and is obtained by connecting three inputs of said adder, corresponding to three least significant digits of said number representing said second addend, to a plurality of logic gates, and by connecting the remaining inputs of said adder directly to outputs of said first means, representing said number K.

15. The circuit arrangement of claim 1, wherein said third means comprise a counter for producing said number N as a plural-bit output count in response to input signals received at counter inputs corresponding to the respective bit positions of said number N, said input signals consisting of said output signals representing the respective frequency value of said voltage controlled oscillator and signals representing said coefficient dependent on the reference oscillation frequency value, and output signals being received from said second means at counter inputs which correspond to more significant bit positions of said number N than the counter inputs which receive said signals representing said coefficient.

16. The circuit arrangement of claim 15, wherein there are provided fourth means for selectively modifying said signals representing said coefficient dependent on the reference oscillation frequency value.

17. The circuit arrangement of claim 16, wherein said fourth means comprise a counter arranged to count up and down.

18. The circuit arrangement of claim 17, wherein the output of the up and down counter corresponds to a binary number, the most significant digit of which is fed in signal form to an input of an arithmetic adder circuit included in said second means.

* * * * *